US010971243B2

(12) United States Patent
Busi et al.

(10) Patent No.: US 10,971,243 B2
(45) Date of Patent: Apr. 6, 2021

(54) BUILT-IN SELF-TEST (BIST) ENGINE CONFIGURED TO STORE A PER PATTERN BASED FAIL STATUS IN A PATTERN MASK REGISTER

(71) Applicant: INTERNATIONAL BUSINESS MACHINES CORPORATION, Armonk, NY (US)

(72) Inventors: Aravindan J. Busi, Bangalore (IN); John R. Goss, South Burlington, VT (US); Paul J. Grzymkowski, Middlesex, VT (US); Krishnendu Mondal, Bangalore (IN); Kiran K. Narayan, Hyderabad (IN); Michael R. Ouellette, Westford, VT (US); Michael A. Ziegerhofer, Jeffersonville, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/548,246

(22) Filed: Aug. 22, 2019

(65) Prior Publication Data

US 2019/0378587 A1 Dec. 12, 2019

Related U.S. Application Data

(63) Continuation of application No. 15/798,858, filed on Oct. 31, 2017, now Pat. No. 10,553,302, which is a (Continued)

(51) Int. Cl.
*G11C 29/38* (2006.01)
*G11C 29/44* (2006.01)
(Continued)

(52) U.S. Cl.
CPC .............. *G11C 29/38* (2013.01); *G11C 29/40* (2013.01); *G11C 29/44* (2013.01);
(Continued)

(58) Field of Classification Search
CPC ... G11C 29/38; G11C 29/70; G11C 29/56004; G11C 29/40; G11C 29/44; G11C 2029/3602; G11C 29/4401
(Continued)

(56) References Cited

U.S. PATENT DOCUMENTS 5,717,701 A * 2/1998 Angelotti ......... G01R 31/31855
714/30
5,825,782 A 10/1998 Roohparvar
(Continued)

FOREIGN PATENT DOCUMENTS

WO 2009039316 3/2009

OTHER PUBLICATIONS

Akrout C., Mifsud, J. P. & Rapoport, S. "Multi-Scan Array Built-In, Self-Test with Result/Fail Bits", IPCOM000105297D, 1993, 36(7), 3 pages.
(Continued)

*Primary Examiner* — James C Kerveros
(74) *Attorney, Agent, or Firm* — L. Jeffrey Kelly; Andrew M. Calderon; Roberts Calderon Safran & Cole, P.C.

(57) ABSTRACT

A BIST engine configured to store a per pattern based fail status during memory BIST run and related processes thereof are provided. The method includes testing a plurality of patterns in at least one memory device and determining which of the plurality of patterns has detected a fail during execution of each pattern. The method further includes storing a per pattern based fail status of each of the detected failed patterns.

20 Claims, 2 Drawing Sheets

Related U.S. Application Data continuation of application No. 14/800,067, filed on Jul. 15, 2015, now Pat. No. 9,881,694.

(51) Int. Cl.
*G11C 29/40* (2006.01)
*G11C 29/56* (2006.01)
*G11C 29/00* (2006.01)
*G11C 29/36* (2006.01)

(52) U.S. Cl.
CPC ........ *G11C 29/56004* (2013.01); *G11C 29/70* (2013.01); *G11C 29/4401* (2013.01); *G11C 2029/3602* (2013.01)

(58) Field of Classification Search
USPC .......................................................... 714/719
See application file for complete search history.

(56) References Cited

U.S. PATENT DOCUMENTS

| | | | |
|---|---|---|---|
| 6,061,813 | A | 5/2000 | Goishi |
| 6,138,257 | A | 10/2000 | Wada et al. |
| 6,175,529 | B1 | 1/2001 | Otsuka et al. |
| 6,530,052 | B1 | 3/2003 | Khou et al. |
| 6,560,740 | B1 | 5/2003 | Zuraski, Jr. et al. |
| 6,587,982 | B1 | 7/2003 | Lee et al. |
| 6,615,378 | B1 | 9/2003 | Dwork |
| 7,137,049 | B2 | 11/2006 | Hoffmann et al. |
| 7,188,289 | B2 | 3/2007 | Nakamura |
| 7,370,251 | B2 | 5/2008 | Nadeau-Dostie et al. |
| 7,523,370 | B1 * | 4/2009 | Keller ............ G01R 31/318547 714/726 |
| 7,610,537 | B2 * | 10/2009 | Dickinson ........... G06F 11/2242 714/30 |
| 7,865,788 | B2 | 1/2011 | Burlison et al. |
| 8,037,376 | B2 | 10/2011 | Anzou et al. |
| 8,086,925 | B2 | 12/2011 | Gass et al. |
| 8,280,687 | B2 | 10/2012 | Cheng et al. |
| 8,639,994 | B2 | 1/2014 | Chen et al. |
| 8,904,256 | B1 | 12/2014 | Chakravadhanula et al. |
| 8,914,688 | B2 | 12/2014 | Belansek et al. |
| 9,448,282 | B1 | 9/2016 | Meehl |
| 9,881,694 | B2 | 1/2018 | Busi et al. |
| 2003/0074619 | A1 | 4/2003 | Dorsey |
| 2006/0282732 | A1 * | 12/2006 | Kiryu ............. G01R 31/318547 714/738 |
| 2007/0234157 | A1 | 10/2007 | Rajski et al. |
| 2007/0288821 | A1 | 12/2007 | Matsuo et al. |
| 2014/0258797 | A1 | 9/2014 | Gorman et al. |
| 2015/0124537 | A1 | 5/2015 | Anzou et al. |
| 2017/0018313 | A1 | 1/2017 | Busi et al. |
| 2017/0229191 | A1 | 8/2017 | Ouellette et al. |
| 2018/0053566 | A1 | 2/2018 | Busi et al. |
| 2018/0061509 | A1 | 3/2018 | Busi et al. |

OTHER PUBLICATIONS

List of IBM Patents or Patent Applications Treated as Related, Aug. 22, 2019, 1 page.

Specification "Built-In Self-Test (BIST) Engine Configured to Store a Per Pattern Based Fail Status in a Pattern Mask Register" and drawings in related U.S. Appl. No. 15/798,858, filed Oct. 31, 2017, 17 pages.

List of IBM Patents or Patent Applications Treated as Related, dated Dec. 6, 2019, 1 page.

Specification "Built-In Self-Test (BIST) Engine Configured to Store a Per Pattern Based Fail Status in a Pattern Mask Register" and Drawings in U.S. Appl. No. 16/675,783, filed Nov. 6, 2019, 18 pages.

Notice of Allowance issued in related U.S. Appl. No. 15/798,858 dated Sep. 25, 2019, 9 pages.

Notice of Allowance dated Feb. 21, 2020 in related U.S. Appl. No. 15/801,444, 9 pages.

\* cited by examiner

Pattern Mask Register

| 0 | 1 | 2 | .... | | | 13 |
|---|---|---|---|---|---|----|

Bit 0 : Mask "Checkerboard"
Bit 1 : Mask " Blanket"
Bit 2 : Mask "Word-Line-Stripe"
.
.
.
Bit 13 : Mask "ENUARB pattern"

BUILT-IN SELF-TEST (BIST) ENGINE CONFIGURED TO STORE A PER PATTERN BASED FAIL STATUS IN A PATTERN MASK REGISTER

FIELD OF THE INVENTION

The invention relates to a built-in-self-test (BIST) engine and, more particularly, to a BIST engine configured to store a per pattern based fail status during memory BIST run and related processes thereof.

BACKGROUND

Memory BIST (built-in self-test) is an important tool for testing memories (including finding/diagnosing and repairing defects within those memories). As more memory is integrated into chips, thorough BIST test and repair is a requirement in order to ensure reasonable product quality/reliability levels. To improve BIST quality oftentimes more test patterns are run as part of manufacturing test. Total test time can take many millions of cycles when all necessary test patterns are included.

Memory BIST is designed to operate as many memories as possible simultaneously, while still avoiding false failures due to over test. False failures may be due to exceeding the power specification for a certain chip design, amongst other fail modes. For a given chip design, this might be a small subset, whereas for other chip designs this could include virtually all memories. In addition, memory BIST should be able to test with some margin compared to the normal functional application in order to produce good SPQL (shipped product quality level) while minimizing impacts to yield. Also, high quality memory test and repair via extremely thorough test needs to be balanced against test time. Test time can be a major cost component of chips (sometimes reaching into the multi-minute range).

During manufacturing test, the BIST engine executes multiple test patterns to test the connected memories. If a fail is detected during the execution of a pattern, the fail information is collected by the BIST engine. If more fails are detected in any of the subsequent patterns, the new fail information is accumulated with the old fail information in the BIST engine. At the end of the test, the BIST has the information whether any of the memories associated with it has failed. But, it is not possible in such methodologies to know the distribution of fails on a per-pattern basis.

SUMMARY

In an aspect of the invention, a method comprises testing a plurality of patterns in at least one memory device and determining which of the plurality of patterns has detected a fail during execution of each pattern. The method further comprises storing a per pattern based fail status of each of the detected failed patterns.

In an aspect of the invention, a method comprises reusing a pattern mask register of a BIST engine to store fail information at a bit location for a pattern that detected a fail.

In an aspect of the invention, a method comprises: issuing an execution command to a BIST engine to run patterns which are not masked by a pattern mask register; enabling the pattern mask register for data collection; after completion of the pattern, determining whether there is a FAIL for the tested pattern and, if so, enable FAIL collection; and updating a corresponding pattern bit in the pattern mask register, which will store the pattern that caught a FAIL.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to a built-in-self-test (BIST) engine and, more particularly, to a BIST engine configured to store a per pattern based fail status during memory BIST run and related processes thereof. In more specific embodiments, a pattern mask register can be re-used to store test results of individual test patterns that have completed diagnostics. In this way, it is possible to generate and access test pass/fail results for particular patterns from a BIST system used to test memory devices.

By implementing the present invention, e.g., providing a structure and method to collect the failure information on per-pattern basis using the existing resources of the BIST engine, it is now possible to know which patterns fail in which Process-Voltage-Temperature (PVT) corner so that the test flow can be optimized to run patterns which are detecting fails in different PVT corners. Moreover, if, in a particular PVT corner, it is observed that the fails are being detected by only a few handful patterns out of the whole pattern suite then, by implementing the systems and processes described herein, the test flow can be optimized to exclude the patterns, which are not detecting any fails, from executing. Also, if it is observed that across PVT corners only a subset of patterns are capturing the fails, then the test flow can be updated accordingly to include only those patterns for execution. Additionally, if a given pattern does find fails but does not find any unique fails (a fail that does not fail any other pattern), then it would be possible to disable that pattern, as all fails found by that pattern will still be found by some other pattern.

In more specific embodiments, the BIST engine contains a pattern mask register where each bit corresponds to a pattern in a pattern suite. When a bit corresponding to a particular pattern is set to '1' in the pattern mask register, the pattern is "masked" and is skipped during the BIST execution. However, when a fail is reported during the execution of a pattern, the pattern mask register is re-used to capture the fail information, e.g., the fail information can be stored at the bit location for the pattern. For example, during the execution of a test pattern, if a fail is detected then a single bit "fail status" register is set to '1'. After the execution of the pattern, the value of the fail status register is written to the particular bit in the pattern mask register which corresponds to the current pattern. Thus, the pattern mask register bits are re-used to capture the fail information. At the end of the BIST run, the pattern mask register is read out to determine which patterns have detected a fail. For example, a bit in the pattern mask register set to '1' implies that the corresponding pattern has detected a fail, whereas a value of '0' implies that no fails were detected during the execution of the particular pattern. A value of '0' can also imply that the pattern was masked.

Figures 1, 2:
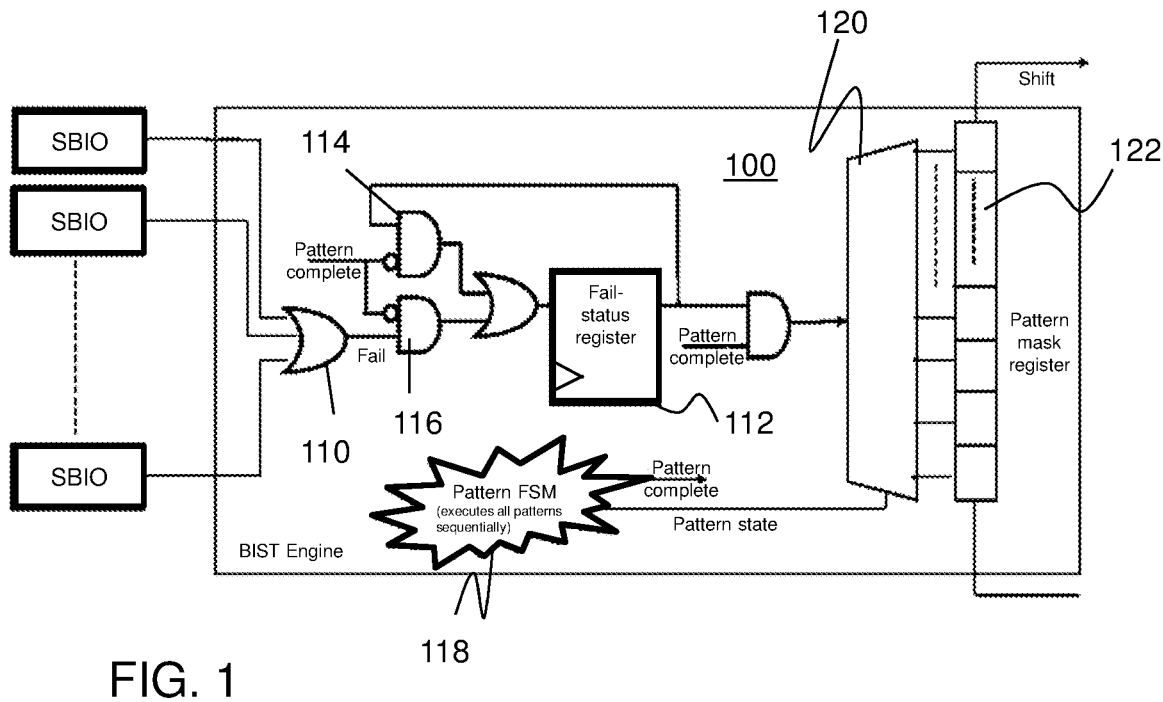
FIG. 1 shows a BIST engine which implements processes in accordance with aspects of the present invention.
FIG. 2 shows an illustrative, non-limiting example of a pattern mask register which can be implemented in the BIST engine of FIG. 1.

FIG. 1 shows a BIST engine in accordance with aspects of the present invention. The BIST engine 100 includes logic 105 comprising AND gates 114 and 116 and OR gates 110, in addition to a bit fail status register 112. The bit fail status register 112 is initialized to '0' at the beginning of the BIST run, as well as before the start of any subsequent pattern execution. The BIST engine 100 further includes demultiplexer 120 and a pattern mask register 122. As described further herein, the pattern mask register 122 not only is used to control whether each individual pattern is to be masked so that it is not run and skipped, it can also store the failed bit which their corresponding patterns have detected a fail. That is, the pattern mask register 122 can be used to collect per pattern fail information in order to aid in the extensive characterization process. In embodiments, the pattern mask register 122 can be re-used to store fail information across all BIST/memory types, and across all chips in the production test flow The demultiplexer 120 is a device which takes a single input signal, e.g., a FAIL ('1') and selects one of many data-output-lines for populating respective bit locations of the pattern mask register 122. In embodiments, the demultiplexer 120 is controlled by an FSM (finite state machine) 118. For example, the FSM 118 will instruct the demultiplexer 120 to input a '1' (FAIL) or a '0' (PASS) into a certain location in the pattern mask register 122, where each bit will represent a PASS/FAIL indication corresponding to a particular pattern in the pattern suite (e.g., pattern mask register) as shown in the example of FIG. 2.

In operation, a FAIL ('1') of any memory (SBIO) will be passed through OR gate 110 to the fail status register 112. The FAIL ('1') will feed back to AND gate 114 of the logic 105 until the pattern is complete, such that when a fail is captured into the fail status register it will stay there until the end of the pattern (i.e. a "sticky latch"), at which time AND gates 114, 116 will be brought to '0', e.g., deactivated, so that a FAIL ('1') will no longer be stored in the fail status register 112. In parallel with this, the FAIL ('1') will be moved into a bit position in the pattern mask register, which corresponds to the pattern that was just completed. In this way, when a FAIL is detected during the execution of a pattern, the fail status register 112 is set to '1' and this '1' stays in the fail status register until the completion of the pattern. At the end of the pattern, the value of the fail status register 112 is written into the bit of the pattern mask register (e.g., control register) 122 by demultiplexer 120, wherein the location corresponds to the current pattern being executed. In embodiments, the FSM 118 will instruct the demultiplexer 120 to input a '1' (FAIL) into a certain location in the pattern mask register 122, where each bit will correspond to a particular failed pattern in the pattern suite (e.g., pattern mask register) as shown in the example of FIG. 2. It should also be noted that the pattern mask register 122 will be set to '0' for any masked pattern (which is not tested).

At the end of the BIST run, when all patterns have been executed, the pattern mask register 122 will have only those bits set to '1', for which their corresponding patterns have detected a fail. Thus, at the end of the BIST run, reading out the pattern mask register 122 will provide the fail status on a per pattern basis. In embodiments, the failing pattern information can be shifted out of the pattern mask register 122 using an existing shuttle register interface.

Figure 3:
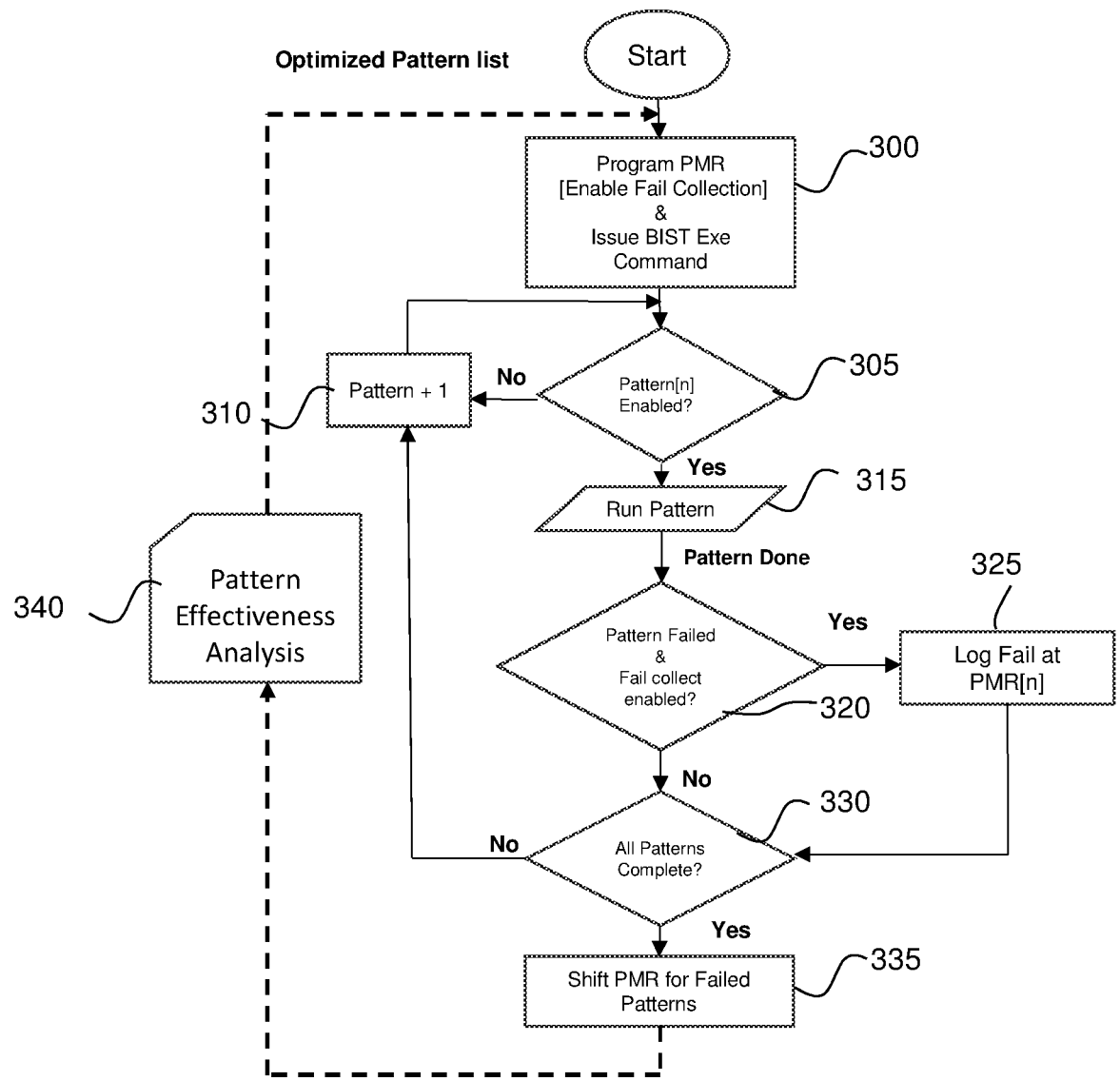
FIG. 3 shows a flow diagram implementing the processes in accordance with aspects of the present invention.

FIG. 3 shows a flow diagram implementing the processes of the present invention. Prior to discussing the processes of the flow diagram, it needs to be recognized that the processes can be implemented with multiple BIST engines. For example, there are different types of BIST engines used for different types of memories, e.g., 1-port, 2-port memories or TCAMs. Using the processes of the present invention, during standard production test, it is now possible to obtain pattern specific fail information for 1-port, 2-port or TCAM specific patterns during normal production testing, without requiring any additional test patterns or test time. Also, some BISTs are connected to larger memories and some are connected to smaller memories. By implementing the processes of the present invention it is now possible to obtain a distribution of fails by pattern, across different types and sizes of memory. Thus, the re-use of the pattern mask register enables access to information about fail distribution on a per-pattern basis for each group of memories sharing a BIST instance and across different types of memory. It is important to be able to collect this information during production testing, because it allows the test pattern characterization and resulting optimization to be performed over an extremely large volume of test data. The processes described herein also allows the test program to be modified so as to reduce test-time by eliminating patterns which, based upon extensive characterization, are determined to be unnecessary as they might never or only very rarely, catch a unique fail.

Referring now to FIG. 3, at step 300, each BIST engine is issued an execution (run) command and the pattern mask register is enabled for data collection. By issuing the execution command, the BIST engine can begin executing the test patterns which are not masked by the pattern mask register. In embodiments, all BIST engine instances on a chip can be run in parallel.

At step 305, a determination is made as to whether the pattern is enabled; in other words, a determination is made as to whether the pattern is masked, in which case the pattern is skipped during the BIST execution. If the pattern is masked, then the processes proceed to the next pattern, at step 310. By way of example, a pattern has been masked in the pattern mask register 122 with a value of '1' in its corresponding bit. It should also be noted that while the BIST engine 100 skips the pattern, the corresponding bit in the pattern mask register will be set to '0'.

If the pattern is not masked, then the processes proceed to step 315. At step 315, the pattern is run. After completion of the pattern, the processes continue to step 320, where a determination is made as to whether there is a FAIL for the tested pattern and, if so, the FAIL collection is enabled. Accordingly, when a FAIL is seen in a particular pattern of an SBIO, this information is sent to the corresponding BIST engine where it is latched and stored in the pattern mask register 22, at step 325. Thus, at the end of each pattern the particular FAIL information is used to update the corresponding pattern bit in the pattern mask register, which will store the fact that that the particular pattern caught a FAIL. The fail status latch is then reset to "0" prior to moving to the next pattern. This happens in all BIST engine instances where a fail is discovered.

At step 330, a determination is made as to whether all of the patterns have been completed, e.g., tested. At the end of the total BIST run, when all the unmasked patterns for all BIST instances have been executed, the failing pattern information, now stored in the pattern mask registers of each BIST, can be shifted from the BIST engines out to the tester using a BIST shuttle readout register, at step 335. At step 340, the process can analyze the data to determine which patterns have failed.

In embodiments, prior to the next BIST run, the pattern mask registers for all BIST instances are re-programmed in order to select which patterns would be masked for the next BIST run. Alternatively, it may be advantageous to not re-program the mask register, and let the failing pattern data for the previous BIST run(s) dictate which patterns would be masked for the remaining BIST run(s). This allows a mechanism to let the logic circuit decide which patterns to disable based upon previous BIST failing pattern data, without needing to analyze this externally (outside the test environment). In this way, the next BIST run would only focus on running patterns which have not yet failed. At the end of a bunch of BIST runs, it would be simple to now read out which patterns have never failed across the multiple BIST runs.

As should now be understood, the collected information can help in faster debug/verification. For example, in known systems in order to determine which patterns had failed, it would be necessary to mask all but one pattern at a time for each test. Once all of the tests are completed for all of the unmasked patterns, it would then be possible to determine which patterns failed, as only one pattern per test would be executed. This is very time consuming and programming intensive for test pattern generation. In comparison, the processes of the present invention can run tests on all patterns, store the failure in the pattern mask register and the read out all of the failures therefrom.

In this way, it is possible to speed up the debug process during initial hardware bring-up. It is also possible to more quickly isolate problem areas in the array and design experiments faster, with more precise target to isolate possible root causes. For example, a pattern that is intended to test for row-to-row short circuiting, might show up as failing quite often, and can help steer the failure analysis team to look for a short circuiting defect in a certain part of the circuit. This feature is useful for obtaining failing pattern information across all parts during standard production test and thus helps in creating a statistical data of the pattern effectiveness and thus can help to optimize the manufacturing test flow, by allowing the intelligent disablement of certain patterns, which are shown to very rarely, if ever, catch a unique fail (e.g., a fail that is only caught by that one pattern).

The processes and systems described herein are also useful in eliminating the need for testing patterns, where there is no unique fail found for the particular pattern. For example, if a same fail is found for several patterns, it can be implied that the fail is not unique to any single pattern. By determining that the fail is not unique to any particular pattern, some patterns can be now skipped or masked effectively increasing test speed and efficiency.

The structure(s) as described above is used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   in executing a test pattern during a first time for a first built-in-self-test (BIST) run, masking, in a pattern mask register of a BIST engine, each test pattern of a plurality of test patterns that indicates a pass status in the pattern mask register;
   reprogramming the pattern mask register before a second BIST run; and
   in the second BIST run, for each test pattern of the plurality of test patterns:
      determining whether or not the test pattern is masked in the pattern mask register of the BIST engine;
      in response to determining that the test pattern is not masked in the pattern mask register of the BIST engine, executing the test pattern a second time which includes:
         determining whether there is a FAIL for the test pattern after the test pattern is executed the second time; and
         sending fail information to the BIST engine for latching and storing the fail information in the pattern mask register in response to a determination that there is the FAIL for the test pattern; and
      in response to determining that the test pattern is masked in the pattern mask register of the BIST engine, skipping the executing the test pattern the second time.

2. The method of claim 1, wherein the plurality of test patterns are fail specific for 1-port, 2-port, or TCAMs.

3. The method of claim 2, wherein, for each of the plurality of test patterns, the pattern mask register is reused to store the pass status value or a fail status value corresponding to the test pattern.

4. The method of claim 2, wherein, for each of the plurality of test patterns, the pass status value or a fail status value is stored at a bit location of the pattern mask register which corresponds to the test pattern.

5. The method of claim 4, wherein, for each of the plurality of test patterns, a first bit value of the pattern mask register that corresponds to the pass status value or a second bit value of the pattern mask register that corresponds to the fail status value is written to the pattern mask register at a location corresponding to the test pattern after the execution of the test pattern the first time.

6. The method of claim 5, further comprising reading out the pattern mask register to determine each of the plurality of patterns that has generated a fail result at the end of a BIST run.

7. The method of claim 6, wherein the first bit value is set to '0' in the pattern mask register and corresponds to each of the plurality of test patterns that has generated a pass result, and the second bit value is set to '1' and corresponds to each of the plurality of test patterns that has generated the fail result during the execution of each of the plurality of test patterns the first time.

8. The method of claim 7, further comprising, for each of the plurality of test patterns, masking the test pattern in response to the first bit value that is set to '0' being stored in the pattern mask register at the location corresponding to the test pattern and skipping the test pattern during BIST execution.

9. The method of claim 2, wherein the pattern mask register further controls that each of the plurality of test patterns is to be masked and skipped during a BIST run in response to a bit that is stored in the pattern mask register, at a location corresponding to each of the plurality of test patterns being set to '0', and the BIST engine generates a pass result during the first BIST run that is stored in a fail status register.

10. The method of claim 2, wherein a bit fail status register is initialized to '0' at a beginning of a BIST run and set to a value of '1' in response to the execution of the test pattern the first time generating a fail result, and at an end of the BIST run of each of the plurality of test patterns, the value of the fail status register is written into a bit of the pattern mask register, wherein each bit of the pattern mask register corresponds to a particular failed pattern in a test pattern suite, and the pattern mask register is configured to mask the test pattern by setting a single bit in a location in the pattern mask register corresponding to the test pattern based on a signal received from a demultiplexer.

11. The method of claim 10, wherein a location of the value within the pattern mask register corresponds to a current test pattern of each of the plurality of test patterns being executed.

12. The method of claim 1, wherein during a BIST run, the FAIL ('1') passes through an OR gate to be stored at a fail register and fed back to an AND gate until a test pattern being executed is complete,
  wherein at an end of a run of the test pattern being executed, the fail register no longer stores the FAIL ('1'),
  wherein, in parallel with the fail register no longer storing the FAIL ('1'), the FAIL ('1') is moved into a bit position in the pattern mask register which corresponds to the test pattern being executed, and
  wherein at an end of the BIST run, after all test patterns have been executed, the pattern mask register having only bits set to '1', for corresponding test patterns that have detected a fail on a per pattern basis such that each bit in pattern mask register corresponds to a particular failed test pattern in the test pattern suite.

13. A method comprising:
  for each test pattern of a plurality of test patterns, in response to execution of the test pattern, a first time, generating a fail result during a first built-in-self-test (BIST) run, masking the test pattern in a pattern mask register;
  reprogramming the pattern mask register before a second BIST run; and
  in the second BIST run, for each test pattern of the plurality of test patterns:
    determining whether or not the test pattern is masked in the pattern mask register;
    in response to determining that the test pattern is not masked in the pattern mask register, executing the test pattern a second time which includes:
      determining whether there is a FAIL for the test pattern after the test pattern is executed the second time; and
      sending fail information to a BIST engine for latching and storing the fail information in the pattern mask register in response to a determination that there is the FAIL for the test pattern; and
    in response to determining that the test pattern is masked in the pattern mask register, skipping the executing the test pattern the second time.

14. The method of claim 13, wherein, for each of the plurality of test patterns, during execution of the test pattern, in response to the test pattern generating the fail result, a single bit, in a location in the pattern mask register corresponding to the test pattern which generated the fail result in the pattern mask register, is set to '1'.

15. The method of claim 14, wherein in the second BIST run, for each of the plurality of test patterns that is masked in the pattern mask register and for which execution is skipped, the single bit corresponding to the location of the test pattern is set to '0'.

16. The method of claim 13, further comprising:
  during the first BIST run, the FAIL ('1') of at least one memory device passes through an OR gate to be stored at a fail register and fed back to an AND gate until the test pattern being executed is complete,
  wherein at an end of a run of the test pattern being executed, the fail register no longer stores the FAIL ('1') of the at least one memory device,
  wherein, in parallel with the fail register no longer storing the FAIL ('1'), the FAIL ('1') is moved into a bit position in the pattern mask register which corresponds to the test pattern being executed; and
  wherein at an end of a BIST run, the pattern mask register is read to determine which test pattern has detected the fail on a per pattern basis such that each bit in pattern mask register corresponds to a particular failed test pattern in a test pattern suite for the at least one memory device.

17. The method of claim 13, wherein the pattern mask register controls whether the test pattern is to be masked and skipped during the second BIST run in response to a bit corresponding to the test pattern being set to "1", the pattern mark register is configured to mask the test pattern by setting a single bit in a location in the pattern mask register corresponding to the test pattern based on a signal received from a demultiplexer, and the BIST engine is configured to generate a pass result during the first BIST run that is stored in a fail status register.

18. A method comprising:
  updating a bit in a pattern mask register to store a fail status value, the bit in a location in the pattern mask register corresponding to a tested pattern that generated a FAIL result during a first built-in-self-test (BIST) run, wherein the updating comprises masking, in the pattern mask register, the tested pattern that generated the FAIL result;
  reprogramming the pattern mask register before a second BIST run; and
  during the second BIST run, in response to determining that the tested pattern is masked in the pattern mask register, skipping executing the tested pattern a second time, and testing a next pattern, and
  in response to determining that the tested pattern is not masked in the pattern mask register, executing the tested pattern the second time which includes:

determining whether there is a FAIL for the tested pattern after the tested pattern is executed the second time; and sending fail information to a BIST engine for latching and storing the fail information in the pattern mask register in response to a determination that there is the FAIL for the tested pattern, wherein the pattern mark register is configured to mask the test pattern by setting a single bit in a location in the pattern mask register corresponding to the test pattern based on a signal received from a demultiplexer.

19. The method of claim 18, further comprising determining all patterns have been tested and, if all patterns have been tested, then information of the pattern that generated the FAIL result stored in the pattern mask register is shifted to a tester using a BIST shuttle readout register.

20. The method of claim 18, wherein prior to a next BIST run, the pattern mask register for all BIST instances is programmed to select which pattern is masked for a next BIST run and not programmed such that a failed pattern for the previous BIST run dictates which pattern is masked for a remaining BIST run, and the BIST engine generates a pass result during the first BIST run that is stored in a fail status register.

* * * * *